US012113508B2

(12) United States Patent
Fujii et al.

(10) Patent No.: US 12,113,508 B2
(45) Date of Patent: Oct. 8, 2024

(54) RESONATOR DEVICE

(71) Applicant: Seiko Epson Corporation, Tokyo (JP)

(72) Inventors: Masahiro Fujii, Shiojiri (JP); Tomoyuki Kamakura, Matsumoto (JP)

(73) Assignee: SEIKO EPSON CORPORATION (JP)

( * ) Notice: Subject to any disclaimer, the term of this patent is extended or adjusted under 35 U.S.C. 154(b) by 488 days.

(21) Appl. No.: 17/545,092

(22) Filed: Dec. 8, 2021

(65) Prior Publication Data

US 2022/0182033 A1 Jun. 9, 2022

(30) Foreign Application Priority Data

Dec. 9, 2020 (JP) ................................ 2020-203956

(51) Int. Cl.
*H03H 9/00* (2006.01)
*H03H 9/02* (2006.01)
*H03H 9/125* (2006.01)

(52) U.S. Cl.
CPC .... *H03H 9/02102* (2013.01); *H03H 9/02047* (2013.01); *H03H 9/125* (2013.01)

(58) Field of Classification Search
CPC ...... H03H 9/02023; H03H 9/19; H03H 9/125; H03H 9/02047; H03H 9/02102
USPC .......................................... 333/186–188, 193
See application file for complete search history.

(56) References Cited

U.S. PATENT DOCUMENTS

2002/0096974 A1 7/2002 Moon et al.
2014/0167870 A1 6/2014 Yamada

FOREIGN PATENT DOCUMENTS

JP H05-075372 A 3/1993
JP 2001-144580 A 5/2001
JP 2002-198768 A 7/2002
JP 2004-128591 A 4/2004
JP 2005-143042 A 6/2005
JP 2011-244488 A 12/2011
JP 2014-121039 A 6/2014

*Primary Examiner* — Rakesh B Patel
(74) *Attorney, Agent, or Firm* — Harness, Dickey & Pierce, P.L.C.

(57) ABSTRACT

A resonator device includes: a resonator element that has a first surface on which a first mount electrode and a second mount electrode are disposed, and a second surface; a base that has a third surface which faces the first surface of the resonator element and on which a first base electrode and a second base electrode are disposed; a lid that has a fourth surface which faces the second surface of the resonator element; a first metal bump by which the first mount electrode and the first base electrode are bonded; a second metal bump by which the second mount electrode and the second base electrode are bonded; and a bonding member by which the second surface and the fourth surface are bonded. A loss tangent of the bonding member is larger than a loss tangent of the first metal bump and the second metal bump.

12 Claims, 12 Drawing Sheets

SW1
64
99
46
402
400
401
46
4h
4r
48
404
400
401
46
4
41
40
42
402
46
99
64
X
Z
Y

SW1
64
5
51
5r
52b(52)
52a(52)
4h
4r
54a
5h
56
85
48
53a
404
4
41
40
42
64
X
Z
Y

SW2
32
31
62
63
3
321
81(80)
61
32
322
63
62
31
32
X
Z
Y 1
32
31
62
32
SW2
321
3
61
81(80)
85
4
41
40
42
62
31
32
5
5r
4h
5h
56
48
64
46
SW1
99
4r
Z
X
Y 1
32
62
64
31
5
SW2
SW1
3
4h
4r
61
56
48
81(80)
85
41
42
40
4
Z
X
Y 1b
41(411)
62
64
7
4
4h
42
S
5
5r
52b(52)
52a(52)
5h
51
54b
54a
53b
85
O4
85
O3b
L1
49
57
O2
61
(80)82
61
(80)81b
48
O1b
56b
53a
L2
X
Y
Z

RESONATOR DEVICE

The present application is based on, and claims priority from JP Application Serial Number 2020-203956, filed Dec. 9, 2020, the disclosure of which is hereby incorporated by reference herein in its entirety.

BACKGROUND

1. Technical Field

The present disclosure relates to a resonator device.

2. Related Art

In a resonator device which is widely used in communication equipment and the like, there is a strong demand for miniaturization, and a piezoelectric resonator piece such as a quartz crystal resonator piece constituting a resonator device is fixed by a mount electrode in a package, so as to reduce a mounting area of the piezoelectric resonator piece while ensuring energization from the mount electrode, thereby achieving miniaturization of the entire device. For example, JP-A-2014-121039 discloses that, in a resonator in which a quartz crystal resonator piece is accommodated between a package base and a lid, a mount electrode of the quartz crystal resonator piece is bonded to an internal terminal of the package base via a conductive bonding member such as a conductive adhesive or a metal bump.

However, in the configuration described in JP-A-2014-121039, when the conductive adhesive is used as the conductive bonding member, a distance between terminals is required to prevent a short circuit between the terminals that is caused by expansion of the conductive bonding member when the mount electrode and the internal terminal are bonded, which hinders the miniaturization. When the metal bump is used as the conductive bonding member, expansion of the conductive bonding member when the mount electrode and the internal terminal are bonded is less than that of the conductive adhesive, which is suitable for the miniaturization, but there is a problem that since rigidity of the metal bump is high, and a resonation damping effect is poor, an oscillation frequency is unstable due to resonation leakage caused by assembly variation or the like.

SUMMARY

A resonator device includes: a resonator element that includes an excitation electrode, and that has a first surface, on which a first mount electrode and a second mount electrode electrically coupled to the excitation electrode are disposed, and a second surface in front-back relationship with the first surface; a base that has a third surface which faces the first surface of the resonator element and on which a first base electrode and a second base electrode are disposed; a lid that has a fourth surface which faces the second surface of the resonator element, and that is bonded to the base so as to accommodate the resonator element; a first metal bump by which the first mount electrode and the first base electrode are bonded and electrically coupled; a second metal bump by which the second mount electrode and the second base electrode are bonded and electrically coupled; and a bonding member by which the second surface and the fourth surface are bonded. A loss tangent of the bonding member at a room temperature is larger than a loss tangent of the first metal bump and the second metal bump at a room temperature.

DESCRIPTION OF EXEMPLARY EMBODIMENTS

1. First Embodiment

Figure 1:
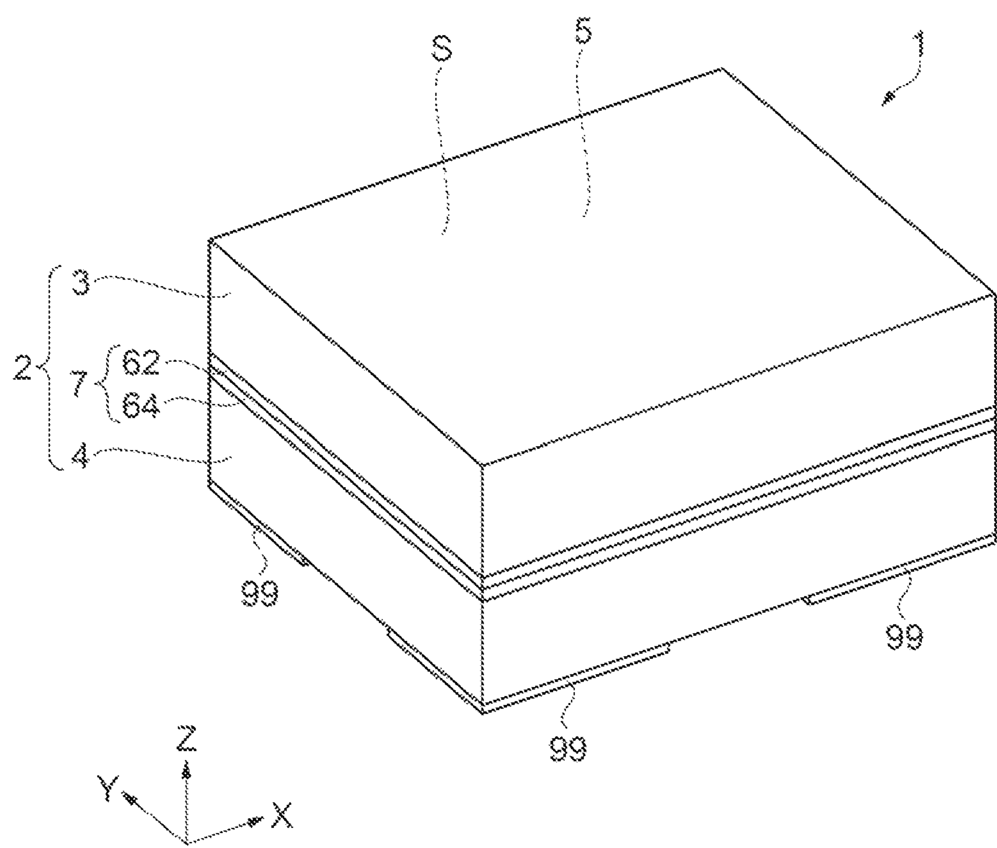
FIG. 1 is a perspective view showing a resonator device according to a first embodiment.

A resonator device 1 according to a first embodiment will be described with reference to FIGS. 1 to 4. FIG. 2 shows a state in which a lid 3 is removed for convenience of description of an internal configuration of the resonator device 1. In the drawings, a dimensional ratio of each component is different from an actual dimensional ratio.

In coordinates illustrated in the drawings, three axes orthogonal to each other are referred to as an X axis, a Y axis, and a Z axis. A direction along the X axis is defined as an "X direction", a direction along the Y axis is defined as a "Y direction", a direction along the Z axis is defined as a "Z direction", and a direction of an arrow is a positive direction. In addition, a positive direction in the Z direction will be described as "upper" or "upper side", and a negative direction in the Z direction will be described as "lower" or "lower side". In a plan view from the Z direction, a surface on a positive side in the Z direction is referred to as an upper surface, and a surface on a negative side in the Z direction opposite to the upper surface is referred to as a lower surface.

Figure 2:
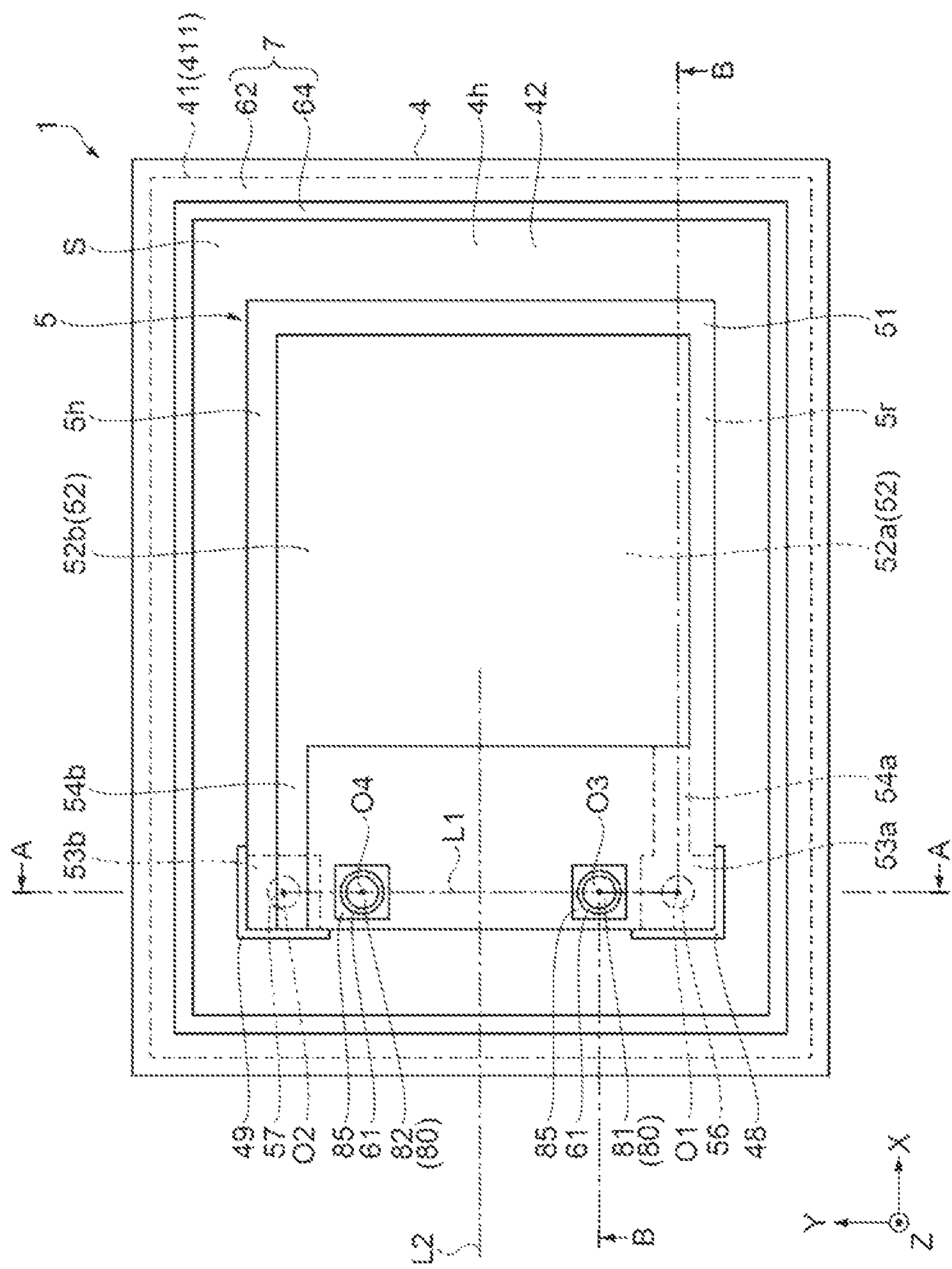
FIG. 2 is a plan view showing a schematic configuration of the resonator device according to the first embodiment.
Figure 3:
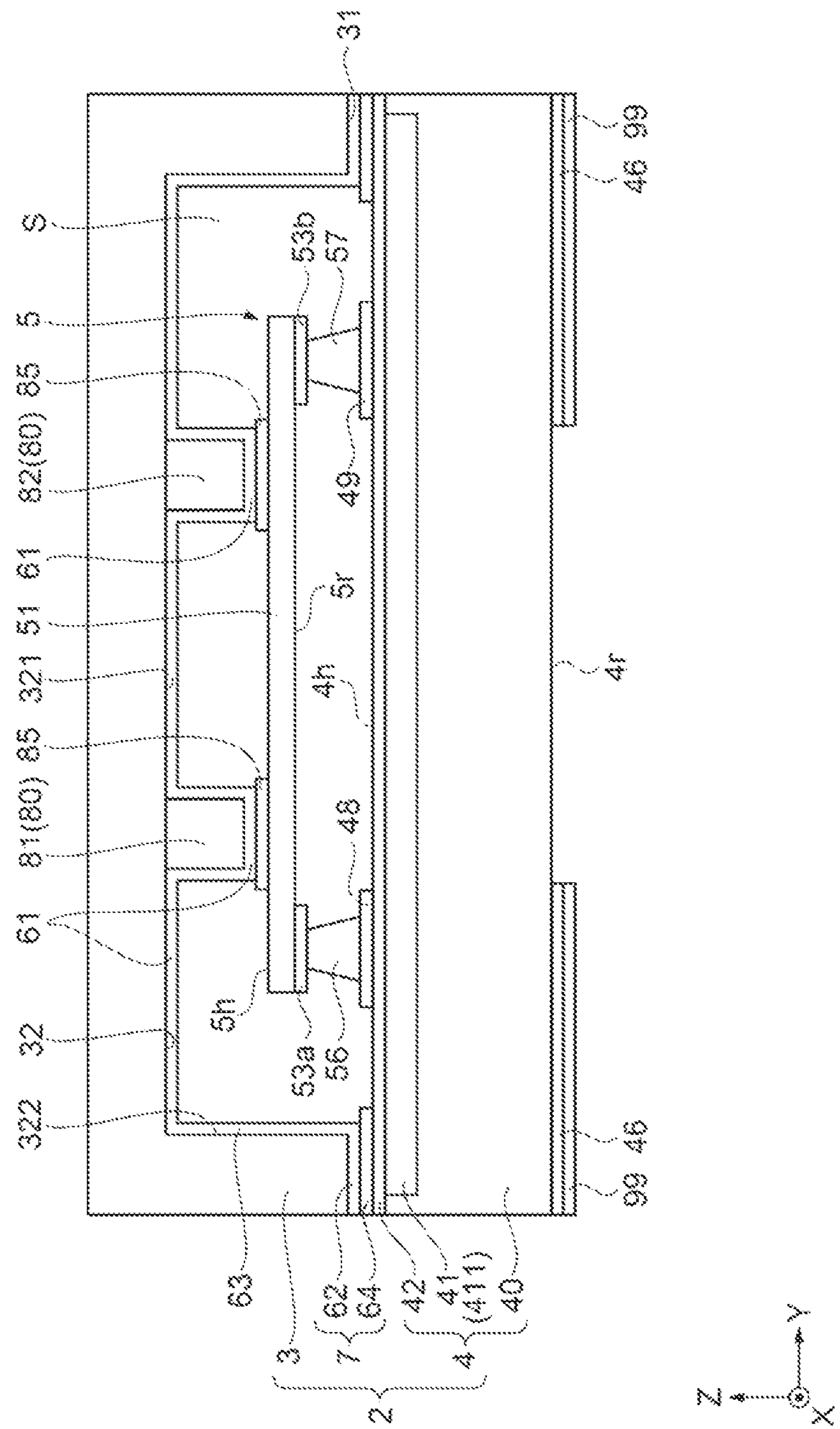
FIG. 3 is a cross-sectional view taken along a line A-A of FIG. 2.
Figure 4:
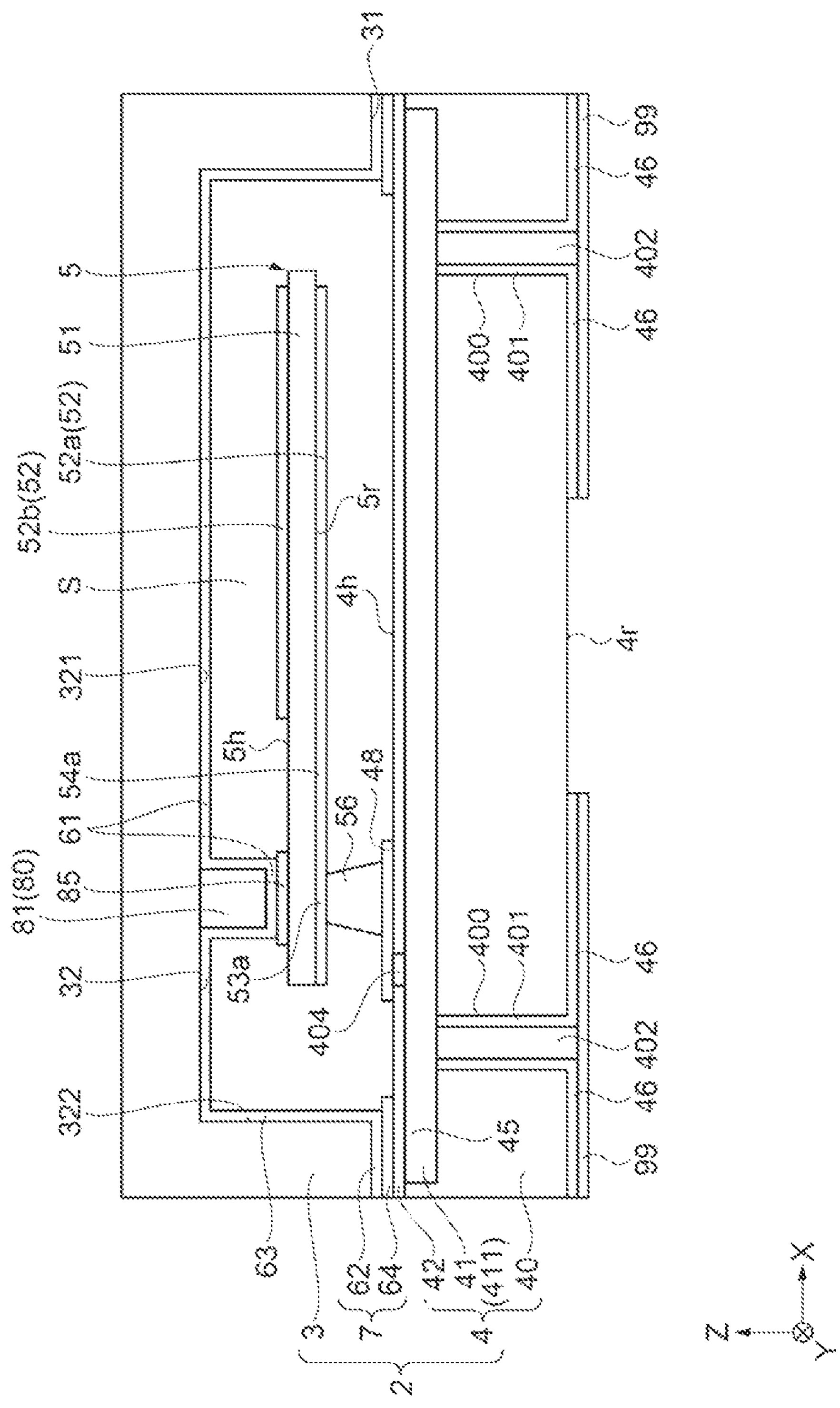
FIG. 4 is a cross-sectional view taken along a line B-B of FIG. 2.

As shown in FIGS. 1, 3, and 4, the resonator device includes a resonator element 5 and a package 2 that accommodates the resonator element 5. The package 2 includes a base 4 having a flat plate shape, the lid 3 as a lid body, and a sealing portion 7. The lid 3 has a recess portion 32 that forms an accommodation space S for accommodating the resonator element 5. The lid 3 is bonded to the base 4 via the sealing portion 7 such that the resonator element 5 is accommodated in the recess portion 32.

As shown in FIGS. 2 to 4, the resonator element 5 includes a resonator substrate 51, excitation electrodes 52 disposed on an upper surface and a lower surface of the resonator substrate 51, a first mount electrode 53*a* and a second mount electrode 53*b* that are disposed on the lower surface of the resonator substrate 51, and a bonding metal layer 85 disposed on the upper surface of the resonator substrate 51. The lower surface of the resonator substrate 51 on which the first mount electrode 53*a* and the second mount electrode 53*b* are disposed is a first surface 5*r* of the resonator element 5. The upper surface of the resonator substrate 51 in a front-back relationship with the first surface 5*r* of the resonator element 5 is a second surface 5*h* of the resonator element 5.

The resonator substrate 51 in the present embodiment is a quartz crystal substrate. The resonator substrate 51 is not limited to a quartz crystal substrate, and may be a piezoelectric crystal body of such as lithium niobate or lithium tantalate.

The excitation electrode 52 includes a first excitation electrode 52*a* disposed on the lower surface of the resonator substrate 51 and a second excitation electrode 52*b* disposed on the upper surface of the excitation electrode 51. The first excitation electrode 52*a* is electrically coupled to the first mount electrode 53*a* via a wiring 54*a* disposed on the lower surface of the resonator substrate 51. The second excitation electrode 52*b* is electrically coupled to the second mount electrode 53*b* via a wiring 54*b* disposed on the upper surface of the resonator substrate 51 and a side surface wiring (not shown). The side surface wiring is a wiring provided on a side surface of the resonator substrate 51 in order to electrically couple the upper surface and the lower surface of the resonator substrate 51.

As described above, the resonator element 5 includes the excitation electrodes 52, the first surface 5*r* on which the first mount electrode 53*a* and the second mount electrode 53*b* electrically coupled to the excitation electrodes 52 are disposed, and the second surface 5*h* in front-back relationship with the first surface 5*r*.

The base 4 includes a base substrate 40 having a flat plate shape, an integrated circuit 41 formed on an upper surface of the base substrate 40, and an insulating layer 42 formed on an upper surface of the integrated circuit 41.

The base substrate 40 in the present embodiment is a silicon substrate. A material forming the base substrate is not limited to silicon, and may be, for example, a semiconductor material such as gallium nitride.

The insulating layer 42 is formed of silicon oxide. The insulating layer 42 has a function of protecting the integrated circuit 41. The insulating layer 42 may not be provided.

The base 4 has a third surface 4*h*, which is an upper surface, and a lower surface 4*r*. The third surface 4*h*, which is the upper surface of the base 4, faces the first surface 5*r*, which is the lower surface of the resonator element 5. A first base electrode 48 and a second base electrode 49 are disposed on the third surface 4*h*. As described above, the base 4 has the third surface 4*h* which faces the first surface 5*r* of the resonator element 5 and on which the first base electrode 48 and the second base electrode 49 are disposed.

Further, a first metal bump 56 and a second metal bump 57 are disposed on the base 4.

The first metal bump 56 is disposed between the first mount electrode 53*a* and the first base electrode 48 in a cross-sectional view from the X direction, an upper surface of the first metal bump 56 is bonded to a lower surface of the first mount electrode 53*a*, and a lower surface of the first metal bump 56 is bonded to an upper surface of the first base electrode 48. In this manner, the first mount electrode 53*a* disposed on the first surface 5*r* of the resonator element 5 and the first base electrode 48 disposed on the third surface 4*h* of the base 4 so as to face the first mount electrode 53*a* are bonded and electrically coupled by the first metal bump 56.

The second metal bump 57 is disposed between the second mount electrode 53*b* and the second base electrode 49 in the cross-sectional view from the X direction, an upper surface of the second metal bump 57 is bonded to a lower surface of the second mount electrode 53*b*, and a lower surface of the second metal bump 57 is bonded to an upper surface of the second base electrode 49. In this manner, the second mount electrode 53*b* disposed on the first surface 5*r* of the resonator element 5 and the second base electrode 49 disposed on the third surface 4*h* of the base 4 so as to face the second mount electrode 53*b* are bonded and electrically coupled by the second metal bump 57.

The first metal bump 56 and the second metal bump 57 are formed of gold (Au). The first metal bump 56 and the second metal bump 57 may be formed of a metal other than gold (Au), such as silver (Ag), or copper (Cu).

The lid 3 includes the bottomed recess portion 32 that is open to a third surface 4*h* side of the base 4, and a contact surface 31 that is formed in a frame shape along an outer edge of the recess portion 32 and that is in contact with the third surface 4*h* of the base 4 via the sealing portion 7. In the present embodiment, the lid 3 is formed of a silicon substrate. However, the lid 3 may be formed of a material other than silicon, such as glass, or ceramics.

The contact surface 31 of the lid 3 and the third surface 4*h* of the base 4 are bonded to each other via the sealing portion 7, and thereby the resonator element 5 is accommodated in the accommodation space S formed by the recess portion 32.

The recess portion 32 of the lid 3 has a fourth surface 321, which is a bottom surface, and a side surface 322. The fourth surface 321, which is the bottom surface of the recess portion 32, faces the second surface 5*h*, which is an upper surface of the resonator element 5.

The lid 3 further includes bonding members 80. The second surface 5*h* of the resonator element 5 and the fourth surface 321 of the lid 3 are bonded by the bonding members 80.

A first metal layer 61 is provided on a lower surface of the bonding member 80, that is, a surface of the bonding member 80 facing the resonator element 5.

The bonding member 80 is bonded to the second surface 5*h* of the resonator element 5 via the first metal layer 61 provided on the lower surface of the bonding member 80 and the bonding metal layer 85 provided on the second surface 5*h* which is the upper surface of the resonator element 5. The bonding member 80 and the bonding metal layer 85 are provided so as to overlap each other in a plan view from the Z direction.

When the bonding member 80 is bonded to the second surface 5*h* of the resonator element 5, the bonding member 80 is slightly elastically deformed and presses the resonator element 5 with a constant load.

The first metal layer 61 and the bonding metal layer 85 are each formed of gold (Au) having a thickness of 100 nm. The first metal layer 61 and the bonding metal layer 85 may be formed of a metal other than gold (Au), such as, copper (Cu).

In the present embodiment, the first metal layer 61 and the bonding metal layer 85 are bonded by activation bonding.

The activation bonding is a method of performing bonding by metal layers to be bonded being irradiated with a neutral argon ion beam or the like to activate surfaces of the metal layers, and then bringing the metal layers whose surfaces were activated into contact with each other. According to such activation bonding, since metal atoms on the surfaces of the metal layers are diffused and reorganized at contact surfaces of the metal layers to perform bonding, strong bonding without a bonding interface is achieved.

A method of bonding the bonding member 80 and the second surface 5*h* of the resonator element 5 is not limited to the activation bonding, and may be atomic diffusion bonding. The bonding member 80 and the resonator element 5 may be bonded by using a known method such as an adhesive instead of providing the first metal layer 61 and the bonding metal layer 85.

The bonding member 80 has a resonation damping effect of reducing resonation leakage caused by assembly variation of the resonator element 5, or the like.

Specifically, by making a loss tangent (tan δ) of the bonding members 80 at a room temperature larger than loss tangent of the first metal bump 56 and the second metal bump 57 at the room temperature, the bonding member 80 can exhibit the resonation damping effect. The room temperature is 25° C.

The loss tangent is a ratio E"/E' of a loss elastic modulus E" to a storage elastic modulus E' in a dynamic viscoelasticity measurement, and is a physical property value indicating that how much energy a material absorbs when the material is deformed. The loss tangent in the present embodiment is a physical property value obtained by a dynamic viscoelasticity measurement in a shear mode at a temperature of 25° C. and a frequency of 10 Hz.

In the present embodiment, the bonding member 80 is a resin bump. In other words, the bonding member 80 is formed of a resin. The bonding member 80 in the present embodiment is formed of epoxy-based resin. The bonding member 80 is not limited to being formed of the epoxy-based resin, and may be formed of benzocyclobutene, polylactic acid, acrylic-based resin, urethane-based resin, or the like.

By forming the bonding member 80 with a resin, it is easy to make the loss tangent of the bonding members 80 at a room temperature larger than the loss tangent of the first metal bump 56 and the second metal bump 57 at a room temperature.

In the present embodiment, the loss tangent of the bonding members 80 at a room temperature is larger than 0.01 and smaller than 2. The loss tangent of the first metal bump 56 and the second metal bump 57 at a room temperature is larger than 0.00001 and smaller than 0.001. That is, the loss tangent of the bonding members 80 at a room temperature is larger than the loss tangent of the first metal bump 56 and the second metal bump 57 at a room temperature.

As described above, by making the loss tangent of the bonding members 80 at a room temperature larger than the loss tangent of the first metal bump 56 and the second metal bump 57 at a room temperature, energy of unnecessary resonation generated due to the assembly variation such as deviation of a mounting position generated, for example, when the resonator element 5 is mounted on the first metal bump 56 and the second metal bump 57 is absorbed by the bonding members 80 having a large loss tangent, so that the resonation leakage due to the assembly variation or the like can be reduced, and an oscillation frequency of the resonator element 5 can be stabilized.

As shown in FIGS. 2 and 3, the bonding member 80 includes a first bonding member 81 and a second bonding member 82.

Here, an arrangement of the first metal bump 56, the second metal bump 57, the first bonding member 81, and the second bonding member 82 in the present embodiment will be described. The first metal bump 56, the second metal bump 57, the first bonding member 81, and the second bonding member 82 are provided at positions of nodes corresponding to resonation modes of the resonator element 5.

As shown in FIG. 2, a line segment L1 is a line segment coupling a center O1 of the first metal bump 56 and a center O2 of the second metal bump 57 in a plan view from the Z direction which is a direction orthogonal to the third surface 4*h* of the base 4. A virtual center line L2 is a line that is orthogonal to the line segment L1 and equally divides the line segment L1 in the plan view from the Z direction. In the present embodiment, the line segment L1 is parallel to the Y direction, and the virtual center line L2 is parallel to the X direction.

The first bonding member 81 and the second bonding member 82 are disposed such that distances from a center O3 of the first bonding member 81 and a center O4 of the second bonding member 82 to the virtual center line L2 are shorter than distances from the center O1 of the first metal bump 56 and the center O2 of the second metal bump 57 to the virtual center line L2 in the plan view from the Z direction. In other words, the first bonding member 81 and the second bonding member 82 are disposed on inner sides with respect to the first metal bump 56 and the second metal bump 57 in the Y direction which is a direction in which the first metal bump 56 and the second metal bump 57 are disposed.

In addition, the first bonding member 81 and the second bonding member 82 are disposed such that at least a part thereof overlaps the line segment L1 coupling the center O1 of the first metal bump 56 and the center O2 of the second metal bump 57 in the plan view from the Z direction which is the direction orthogonal to the third surface 4*h* of the base 4.

Specifically, the center O3 of the first bonding member 81 and the center O4 of the second bonding member 82 are disposed so as to overlap the line segment L1 coupling the center O1 of the first metal bump 56 and the center O2 of the second metal bump 57 in the plan view from the Z direction.

In addition, the first bonding member 81 and the second bonding member 82 are disposed line-symmetrically with respect to the virtual center line L2 which is orthogonal to the line segment L1 coupling the center O1 of the first metal bump 56 and the center O2 of the second metal bump 57 and equally divides the line segment L1 in the plan view from the Z direction.

By disposing the first bonding member 81 and the second bonding member 82 as described above, the resonation damping effect of the bonding member 80 is exhibited and distortion of the resonator element 5 caused by the bonding member 80 is reduced, and thereby it is possible to further stabilize the oscillation frequency of the resonator element 5. This will be described with reference to FIGS. 3 and 5.

Figure 5:
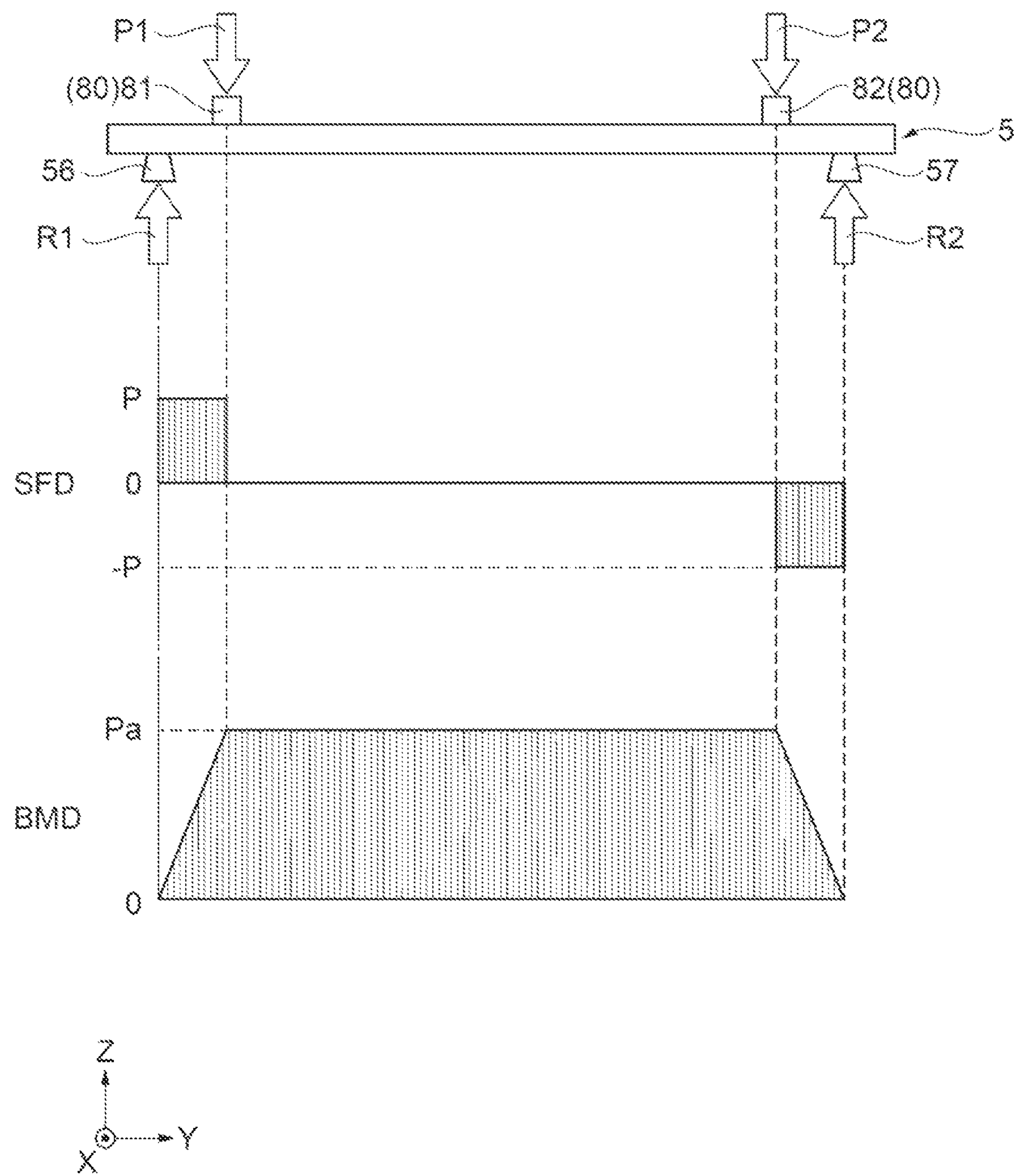
FIG. 5 is a diagram illustrating a load and a reaction force applied to a resonator element of the resonator device according to the first embodiment.

An upper part of FIG. 5 illustrates a model of the resonator element 5, the first metal bump 56, the second metal bump 57, the first bonding member 81, and the second bonding member 82 shown in FIG. 3. The resonator element 5 is a simple support beam whose both ends are supported by the first metal bump 56 and the second metal bump 57, and receives loads from the first bonding member 81 and the second bonding member 82. That is, the resonator element 5 receives loads P1, P2 from the first bonding member 81 and the second bonding member 82, respectively, and receives reaction forces R1, R2 from the first metal bump 56 and the second metal bump 57, respectively. The load P1 from the first bonding member 81 and the load P2 from the second bonding member 82 are equal to each other.

A middle part of FIG. 5 shows a shear force diagram (SFD) showing a shear force in the Y direction applied to the resonator element 5 in the upper part of FIG. 5, and a lower part of FIG. 5 shows a bending moment diagram (BMD) showing a bending moment in the Y direction applied to the resonator element 5 in the upper part of FIG. 5. As shown in the shear force diagram and the bending moment diagram, between the first bonding member 81 and the second bonding member 82, the shear force in the Y direction is zero, and the bending moment in the Y direction is a constant value Pa.

As described above, distortion in the Y direction caused by the resonator element 5 receiving the forces from the first metal bump 56, the second metal bump 57, the first bonding member 81, and the second bonding member 82 is constant between the first bonding member 81 and the second bonding member 82, so that unnecessary resonation is less likely to occur, and the oscillation frequency of the resonator element 5 can be stabilized.

As shown in FIG. 2, in the present embodiment, since the center O3 of the first bonding member 81 and the center of the second bonding member 82 are disposed so as to overlap the line segment L1 coupling the center O1 of the first metal bump 56 and the center O2 of the second metal bump 57 in the plan view from the Z direction, a bending moment in the X direction which is a direction orthogonal to the line segment L1 is not generated in the resonator element 5. That is, since distortion of the resonator element 5 in the X direction does not occur, the oscillation frequency of the resonator element 5 can be further stabilized.

The center O3 of the first bonding member 81 and the center O4 of the second bonding member 82 may not overlap the line segment L1 coupling the center O1 of the first metal bump 56 and the center O2 of the second metal bump 57.

For example, by disposing the first bonding member 81 and the second bonding member 82 on inner sides with respect to the first metal bump 56 and the second metal bump 57 in the Y direction which is the direction in which the first metal bump 56 and the second metal bump 57 are disposed, the distortion of the resonator element 5 in the Y direction can be reduced between the first bonding member 81 and the second bonding member 82. Accordingly, the oscillation frequency of the resonator element 5 can be further stabilized as compared with a case where the first bonding member 81 and the second bonding member 82 are not disposed on the inner sides with respect to the first metal bump 56 and the second metal bump 57 in the Y direction.

For example, by disposing at least a part of the first bonding member 81 and the second bonding member 82 to overlap the line segment L1 coupling the center O1 of the first metal bump 56 and the center O2 of the second metal bump 57 in the plan view from the Z direction, the distortion of the resonator element 5 in the X direction and the Y direction can be reduced between the first bonding member 81 and the second bonding member 82. Accordingly, the oscillation frequency of the resonator element 5 can be further stabilized as compared with a case where the first bonding member 81 and the second bonding member 82 do not overlap the line segment L1 in the plan view from the Z direction.

In addition, in the present embodiment, the first bonding member 81 and the second bonding member 82 are disposed line-symmetrically with respect to the virtual center line L2 which is orthogonal to the line segment L1 coupling the center O1 of the first metal bump 56 and the center O2 of the second metal bump 57 and equally divides the line segment L1, in the plan view from the Z direction. Accordingly, the loads P1, P2 from the first bonding member 81 and the second bonding member 82 are equally applied to the resonator element 5 on a negative side in the Y direction and a positive side in the Y direction with the virtual center line L2 as an axis of symmetry. As a result, since the resonator element 5 does not incline in the Y direction, that is, in the direction of the first metal bump 56 or the second metal bump 57, the oscillation frequency of the resonator element 5 can be stabilized.

Next, the base 4 will be described in detail with reference to FIGS. 2 to 4.

As described above, the base 4 includes the base substrate 40, the integrated circuit 41 formed on the upper surface of the base substrate 40, and the insulating layer 42 formed on the upper surface of the integrated circuit 41.

The integrated circuit 41 is a circuit in which active elements such as a plurality of transistors (not shown) are electrically coupled by wirings (not shown). The integrated circuit 41 includes an oscillation circuit 411. The oscillation circuit 411 oscillates the resonator element 5 to generate a frequency of a reference signal such as a clock signal. The integrated circuit 41 may include, in addition to the oscillation circuit 411, a temperature compensation circuit that corrects resonation characteristic of the resonator element 5 according to a temperature change, a processing circuit that processes an output signal from the oscillation circuit, an electrostatic protection circuit, and the like.

The integrated circuit 41 includes a plurality of terminals (not shown). The plurality of terminals are formed on an upper surface and a lower surface of the integrated circuit 41, and are electrically coupled to the integrated circuit 41. The plurality of terminals include a terminal coupled to a power supply potential, a terminal coupled to a ground potential, a terminal from which an oscillation signal is output, and the like.

The first base electrode 48 and the second base electrode 49 are provided on an upper surface of the insulating layer 42 of the base 4, that is, the third surface 4*h* of the base 4. The first base electrode 48 is electrically coupled to the integrated circuit 41 including the oscillation circuit 411 via a wiring 404 penetrating the insulating layer 42 and a terminal (not shown) provided on the upper surface of the integrated circuit 41. Similar to the first base electrode 48, the second base electrode 49 is electrically coupled to the integrated circuit 41 including the oscillation circuit 411 via a wiring (not shown) penetrating the insulating layer 42 and a terminal (not shown) provided on the upper surface of the integrated circuit 41.

As described above, the first base electrode 48 and the second base electrode 49 are electrically coupled to the first excitation electrode 52*a* and the second excitation electrode 52*b* of the resonator element 5 via the first metal bump 56 and the second metal bump 57, the first mount electrode 53*a* and the second mount electrode 53*b* of the resonator element 5, and the wirings 54*a* and 54*b*, respectively. In this manner, the oscillation circuit 411 provided in the integrated circuit 41 formed on the base 4 is electrically coupled to the first excitation electrode 52*a* and the second excitation electrode 52*b* via the first metal bump 56 and the second metal bump 57.

By electrically coupling the oscillation circuit 411 to the first excitation electrode 52*a* and the second excitation electrode 52*b* via the first metal bump 56 and the second metal bump 57, the resonator element 5 can be oscillated according to an oscillation signal output from the oscillation circuit 411.

In this way, by electrically coupling the oscillation circuit 411 provided in the integrated circuit 41 provided on the base 4 to the excitation electrode 52 via the first metal bump 56 and the second metal bump 57, the oscillation circuit 411 and the excitation electrode 52 can be reliably electrically coupled, and thus a size of the resonator device 1 can be reduced.

The base substrate 40 includes a through hole 400 penetrating the base substrate 40 in a thickness direction, an insulating layer 401 provided on an inner wall surface of the through hole 400, and a through electrode 402 inserted into the through hole 400.

The base substrate 40 includes an insulating layer 46 provided on a lower surface of the base substrate 40 and external terminals 99 provided on a lower surface of the insulating layer 46.

An upper surface of the through electrode 402 is electrically coupled to the integrated circuit 41 via a terminal (not shown) disposed on the lower surface of the integrated circuit 41. A lower surface of the through electrode 402 is electrically coupled to the external terminal 99. The external terminal 99 and the integrated circuit 41 are electrically coupled to each other via the through electrode 402 and the terminal (not shown), thereby a power supply potential or a ground potential can be supplied to the integrated circuit 41 via the external terminal 99, and a clock signal or the like can be output from the integrated circuit 41.

A fourth metal layer 64 is provided on the upper surface of the insulating layer 42 of the base 4, that is, the third surface 4*h* of the base 4. The fourth metal layer 64 is disposed in a frame shape along an outer edge of the third surface 4*h* in the plan view from the Z direction. In the present embodiment, the fourth metal layer 64 is formed of gold (Au) having a thickness of 100 nm. The fourth metal layer 64 may be formed of a metal other than gold (Au), such as, copper (Cu). The fourth metal layer 64 is activated and bonded to a second metal layer 62 provided on the contact surface 31 of the lid 3 to be described later, thereby forming the sealing portion 7.

Next, the lid 3 will be described in detail with reference to FIGS. 3 and 4.

As described above, the lid 3 includes the recess portion 32 that is open to the third surface 4*h* side of the base 4, and the contact surface 31 that is in contact with the third surface 4*h* of the base 4. The recess portion 32 has the fourth surface 321, which is the bottom surface, and the side surface 322. The bonding member 80 is provided on the fourth surface 321. The first metal layer 61 is provided on the lower surface of the bonding member 80, that is, the surface facing the resonator element 5.

As shown in FIGS. 3 and 4, the first metal layer 61 is formed so as to cover the bonding member 80 and the fourth surface 321 in addition to the lower surface of the bonding member 80. In other words, the first metal layer 61 is provided over the entire surfaces of the bonding member 80 and the fourth surface 321 of the lid 3, and overlaps the resonator element 5 and the integrated circuit 41 in the plan view from the Z direction.

Since the bonding member 80 is covered by the first metal layer 61, a gas discharged from the bonding member 80 after the resonator element 5 is sealed in the accommodation space S can be reduced. By reducing the gas discharged from the bonding member 80, a temporal change in the oscillation frequency of the resonator element 5 can be reduced.

The second metal layer 62 is provided on the contact surface 31 of the lid 3. In the present embodiment, the second metal layer 62 is formed of gold (Au) having a thickness of 100 nm. The second metal layer 62 may be formed of a metal other than gold (Au), such as, copper (Cu).

The second metal layer 62 is activated and bonded to the fourth metal layer 64 provided on the third surface 4*h* of the base 4, thereby forming the sealing portion 7. The sealing portion 7 and at least a part of the integrated circuit 41 overlap each other in the plan view from the Z direction.

A method of forming the sealing portion 7 is not limited to the activation bonding, and the sealing portion 7 may be formed by performing atomic diffusion bonding on the second metal layer 62 and the fourth metal layer 64. Alternatively, by bonding the contact surface 31 of the lid 3 and the third surface 4*h* of the base 4 using a known method such as an adhesive, or the like instead of providing the second metal layer 62 and the fourth metal layer 64, and thereby forming the sealing portion 7 by an adhesive, or the like.

A third metal layer 63 is provided on the side surface 322 of the recess portion 32. The third metal layer 63 is electrically coupled to the first metal layer 61 and the second metal layer 62. In other words, the first metal layer 61 and the second metal layer 62 are electrically coupled to each other via the third metal layer 63.

In this way, by electrically coupling the first metal layer 61, the second metal layer 62, the third metal layer 63, the first metal layer 61 and the third metal layer 63 can function as shielding layers, and the resonator element and the integrated circuit 41 can be protected from disturbance such as undesired radiation. For example, the fourth metal layer 64 electrically coupled to the second metal layer 62 by activation bonding is electrically coupled to the integrated circuit 41 by a wiring (not shown), and a constant potential such as the power supply potential or the ground potential is supplied from the integrated circuit 41 to the second metal layer 62 via the fourth metal layer 64, so that the first metal layer 61 and the third metal layer 63 electrically coupled to the second metal layer 62 can function as the shielding layers.

In the present embodiment, the first metal layer 61 is bonded to the bonding metal layer 85 on the lower surface of the bonding member 80, but the bonding metal layer 85 does not function as an electrode for the resonator element 5. However, by electrically coupling the integrated circuit 41 and the bonding metal layer 85 via the fourth metal layer 64, the second metal layer 62, the third metal layer 63, and the first metal layer 61, the bonding metal layer 85 may function as the electrode for the resonator element 5, and for example, the resonator element 5 may be driven.

As described above, in the present embodiment, the first metal layer 61, the bonding metal layer 85, the second metal layer 62, and the fourth metal layer 64 are formed of gold (Au). Since the first metal layer 61, the bonding metal layer 85, the second metal layer 62, and the fourth metal layer 64 contain gold (Au), no metal oxide film is formed on surfaces of the first metal layer 61, the bonding metal layer 85, the second metal layer 62, and the fourth metal layer 64. Accordingly, when the first metal layer 61 and the bonding metal layer 85 or the second metal layer 62 and the fourth metal layer 64 are subjected to the activation bonding, it is not necessary to remove a metal oxide film in advance, so that the activation bonding can be easily performed.

In addition, an adhesion layer may be provided between the first metal layer 61 and the bonding member 80, between the first metal layer 61 and the fourth surface 321 of the lid 3, between the second metal layer 62 and the contact surface 31 of the lid 3, between the third metal layer 63 and the side surface 322 of the recess portion 32 of the lid 3, or between the fourth metal layer 64 and the third surface 4*h* of the base 4. For the adhesion layer, titanium (Ti), tungsten (W), an alloy of titanium (Ti) and tungsten (W), or the like can be used.

Figure 6:
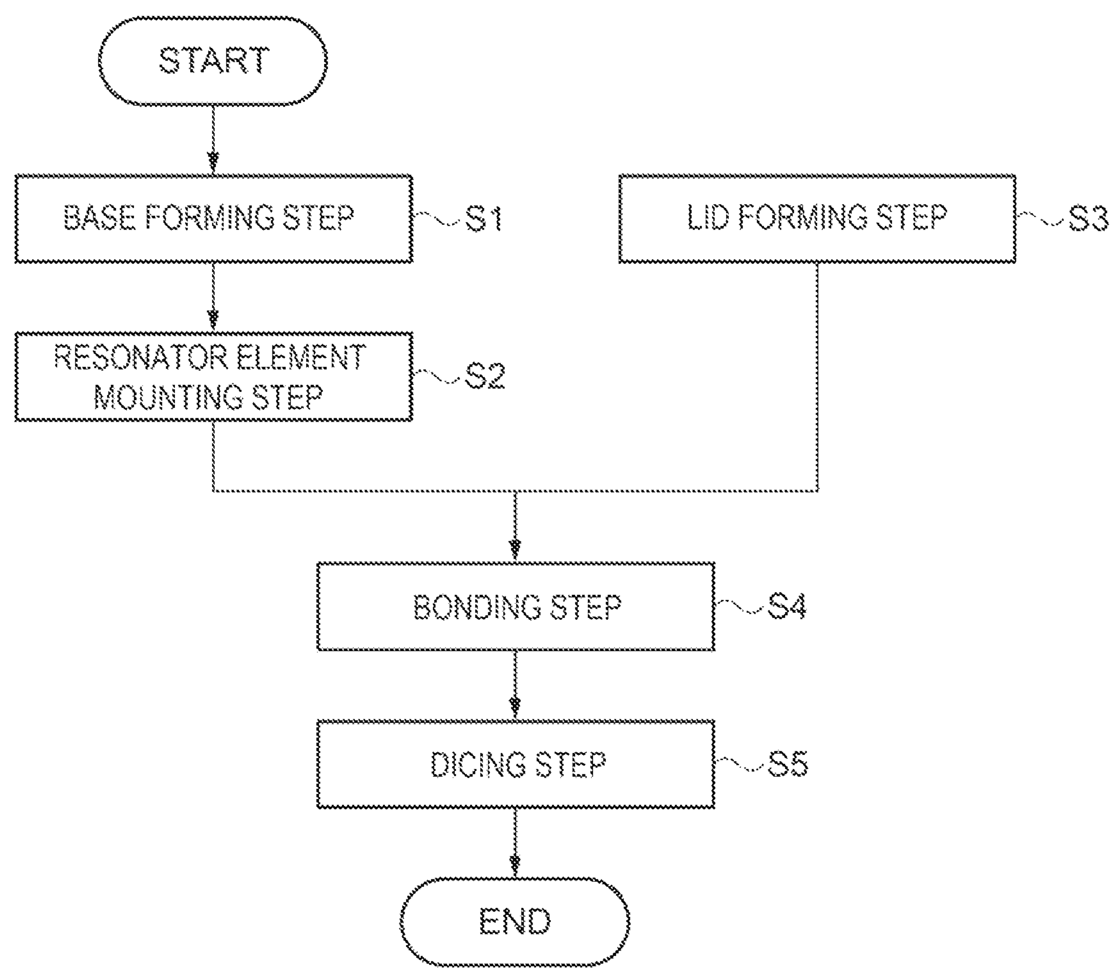
FIG. 6 is a flowchart showing a main manufacturing process of the resonator device according to the first embodiment.

Next, a method of manufacturing the resonator device 1 will be described with reference to FIGS. 6 to 11. As shown in FIG. 6, the method of manufacturing the resonator device 1 includes a base forming step, a resonator element mounting step, a lid forming step, a bonding step, and a dicing step.

1.1 Base Forming Step

Figure 7:
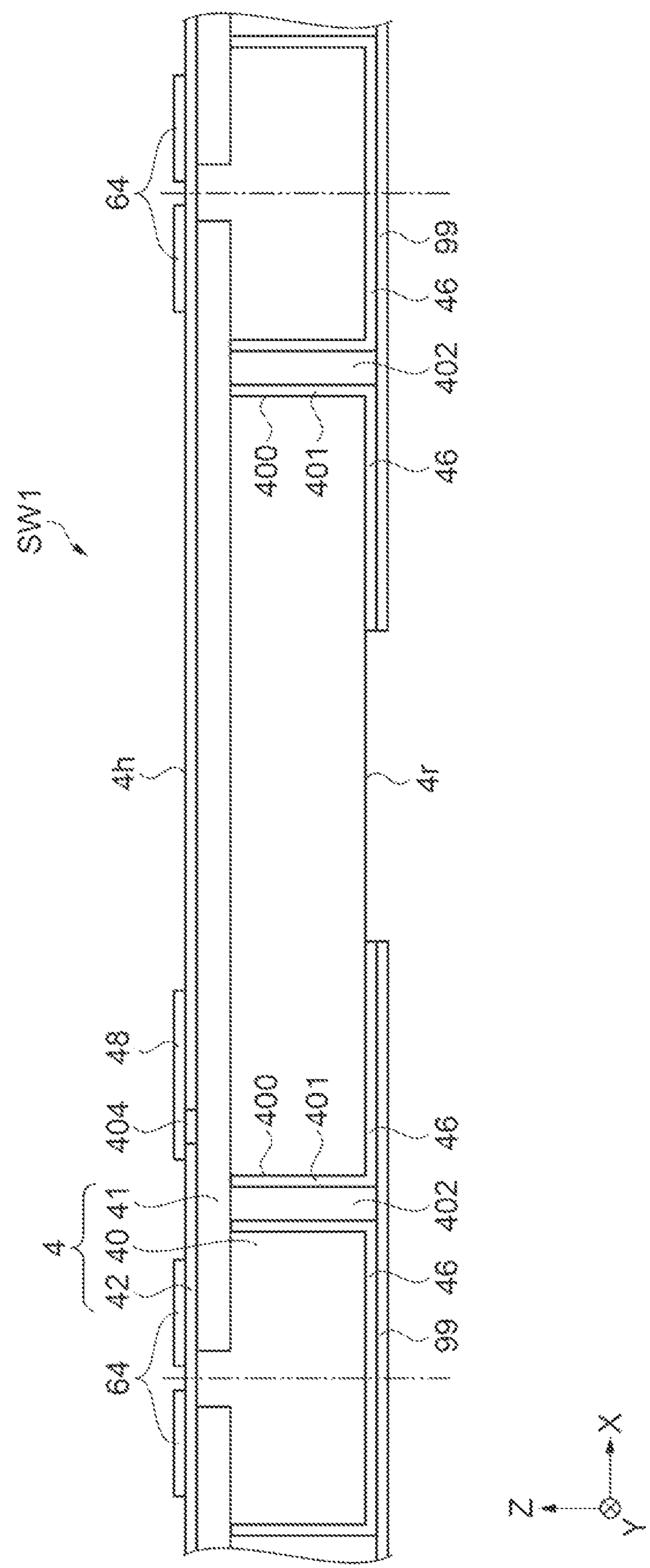
FIG. 7 is a schematic cross-sectional view showing the manufacturing process of the resonator device according to the first embodiment.

As shown in FIG. 7, in step S1, the base 4 is formed. A silicon wafer SW1 in which a plurality of base substrates 40 are integrated is prepared, and the through holes 400 are formed by using an etching technique such as a Bosch process. The insulating layers 401 are formed on the inner wall surfaces of the through holes 400, and then polysilicon into which boron ions are poured is embedded in the through holes 400 to form the through electrodes 402. After the through electrodes 402 are formed, the integrated circuits 41 each including the oscillation circuit 411 are formed on the upper surfaces of the plurality of base substrates 40. After the integrated circuit 41 is formed, the insulating layer 42 and the insulating layer 46 are formed, and the external terminals 99, the wiring 404, the base electrodes 48, 49, and the fourth metal layer 64 are further formed.

The base electrodes 48, 49 and the fourth metal layer can be simultaneously formed, for example, by using a sputtering technique to form a film of gold (Au), and using a photolithography technique and an etching technique to pattern the film.

The insulating layer 46 and the external terminals 99 provided on the lower surface 4*r* of the base 4 may be formed after the bonding step to be described later.

1.2 Resonator Element Mounting Step

Figure 8:
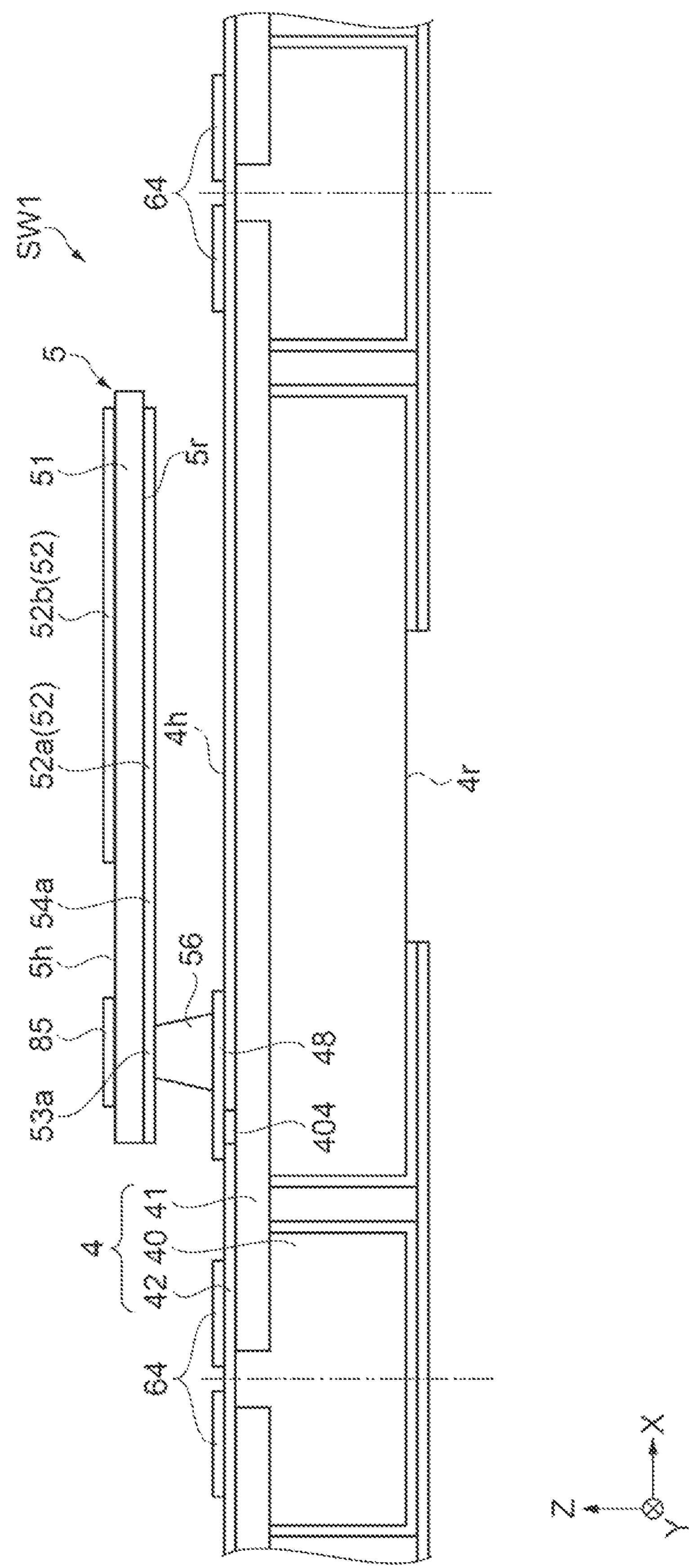
FIG. 8 is a schematic cross-sectional view showing the manufacturing process of the resonator device according to the first embodiment.

As shown in FIG. 8, in step S2, the first mount electrode 53*a* and the second mount electrode 53*b* disposed on the first surface 5*r*, which is the lower surface of the resonator element 5, and the base electrodes 48, 49 provided on the third surface 4*h*, which is the upper surface of the base 4, are bonded to each other via the metal bumps 56, 57. As a result, the resonator element 5 is bonded and fixed to the third surface 4*h* of the base 4.

1.3 Lid Forming Step

Figure 9:
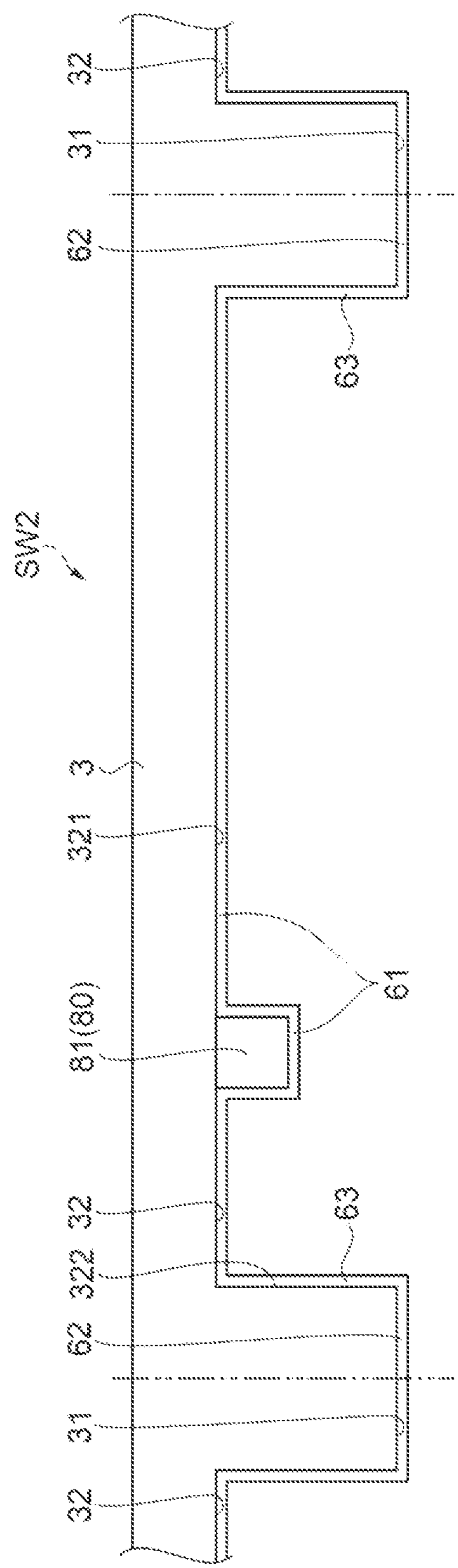
FIG. 9 is a schematic cross-sectional view showing the manufacturing process of the resonator device according to the first embodiment.

As shown in FIG. 9, in step S3, the lid 3 is formed. A silicon wafer SW2 in which a plurality of lids 3 are integrated is prepared, and the recess portions 32 are formed on a lower surface of the silicon wafer SW2, that is, the lower surfaces of the lids 3, by using a silicon etching technique such as the Bosch process. After the recess portion 32 is formed, the bonding members 80 are provided on the fourth surface 321, which is the bottom surface of the recess portion 32.

In the present embodiment, the bonding member 80 is a resin bump. The resin bump can be formed at a predetermined position on the fourth surface 321 by, for example, applying a photosensitive resin to the fourth surface 321 of the lid 3 and using a photolithography technique to pattern the photosensitive resin.

After the bonding members 80 are formed on the fourth surface 321 of the lid 3, the first metal layer 61 is formed so as to cover the bonding members 80 and the fourth surface 321 of the lid 3. The second metal layer 62 and the third metal layer 63 are formed on the contact surface 31 of the lid 3 and the side surface 322 of the recess portion 32 of the lid 3, respectively. The first metal layer 61, the second metal layer 62, and the third metal layer 63 can be simultaneously formed by using, for example, a sputtering technique to form a film of gold (Au) on the entire lower surface of the silicon wafer SW2.

In the present embodiment, the thickness of the first metal layer 61 is set to 100 nm, but the thickness is not limited thereto, and may be, for example, 20 nm or less. Since visible light or infrared light can be transmitted through the first metal layer 61 by setting the thickness of the first metal layer 61 to 20 nm or less, the inside of the resonator device 1, for example, the resonator element 5 can be inspected, and a resonance frequency of the resonator element 5 can be adjusted using the visible light or infrared light transmitting through the first metal layer 61.

1.4 Bonding Step

Figure 10:
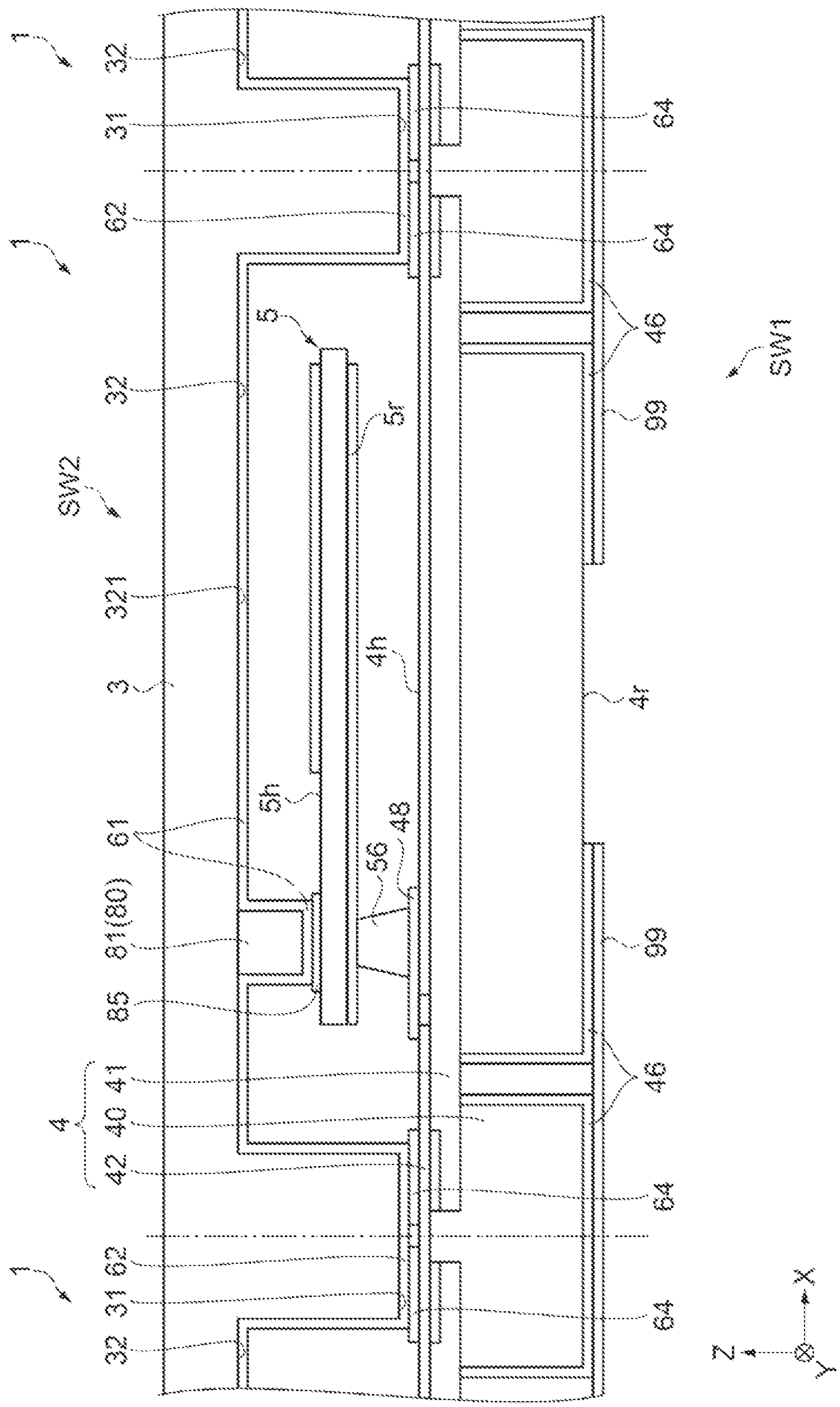
FIG. 10 is a schematic cross-sectional view showing the manufacturing process of the resonator device according to the first embodiment.

As shown in FIG. 10, in step S4, the third surface 4*h*, which is the upper surface of the base 4, and the contact surface 31 of the lid 3 are bonded to each other via the second metal layer 62 and the fourth metal layer 64. In addition, the bonding member 80 and the resonator element 5 are bonded via the first metal layer 61 provided on the lower surface of the bonding member 80, that is, the surface facing the resonator element 5, and the bonding metal layer 85 provided on the second surface 5*h* which is the upper surface of the resonator element 5. The bonding between the third surface 4*h*, which is the upper surface of the base 4, and the contact surface 31 of the lid 3 and the bonding between the bonding member 80 and the resonator element 5 can be simultaneously performed. In this manner, the silicon wafer SW1 and the silicon wafer SW2 are bonded to each other to obtain a silicon wafer in which a plurality of resonator devices 1 are integrally formed.

At this time, a height of the bonding member 80 in step S3 before bonding the third surface 4*h* of the base 4 and the contact surface 31 of the lid 3, that is, a distance from the upper surface to the lower surface of the bonding member 80 is set to be larger than a height of a gap from the second surface 5*h* of the resonator element 5 to the fourth surface 321 of the lid 3 after bonding the third surface 4*h* of the base 4 and the contact surface 31 of the lid 3 in step S4. Accordingly, when the third surface 4*h* of the base 4 and the contact surface 31 of the lid 3 are bonded to each other in step S4, the bonding member 80 is elastically deformed, and a load is generated from the bonding member 80 to the resonator element 5. The upper surface of the bonding member 80 is a surface of the bonding member 80 that is bonded to the fourth surface 321 of the lid, and the lower surface of the bonding member 80 is a surface of the bonding member 80 that faces the resonator element 5.

As a method of bonding the third surface 4*h*, which is the upper surface of the base 4, and the contact surface 31 of the lid 3, and the method of bonding the bonding member 80 and the resonator element 5, the activation bonding is used in the present embodiment as described above. In the activation bonding, the bonding between the second metal layer 62 and the fourth metal layer 64 and the bonding between the first metal layer 61 and the bonding metal layer 85 can be performed only by the free surface energy of the respective surfaces thereof, so that the bonding can be performed at a room temperature without positive pressurization.

As described above, since excessive pressure or heat is not applied at the time of bonding, in the bonding between the second metal layer 62 and the fourth metal layer 64, that is, the bonding between the third surface 4*h* of the base 4 and the contact surface 31 of the lid 3, a residual stress in the package 2 after the bonding can be reduced, so that fluctuation on the oscillation frequency of the resonator element 5 can be reduced.

In addition, even when the sealing portion 7 formed by bonding the second metal layer 62 and the fourth metal layer 64 and at least a part of the integrated circuit 41 overlap each other in the plan view from the Z direction, breakage of the integrated circuit 41 at the time of bonding can be reduced. In this manner, since the sealing portion 7 and at least a part of the integrated circuit 41 can be overlapped with each other in the plan view, the resonator device 1 can be reduced in size.

In addition, in the bonding between the first metal layer 61 and the bonding metal layer 85, that is, the bonding between the bonding member 80 and the resonator element 5, the distortion of the resonator element 5, expansion of the metal bumps 56, 57, and the like can be reduced.

After the bonding step, a thickness of the silicon wafer may be reduced by polishing and grinding to reduce a thickness of the resonator device 1. Specifically, an upper surface of the silicon wafer in which the plurality of resonator devices 1 are integrally formed, that is, an upper surface of the lid 3 may be polished and ground to reduce the thickness of the resonator device 1, or a lower surface of the silicon wafer, that is, the lower surface 4*r* of the base 4 may be polished and ground to reduce the thickness of the resonator device 1. When the thickness of the silicon wafer is reduced by polishing and grinding the lower surface 4*r* of the base 4 after the bonding step, the insulating layer 46 and the external terminals 99 are formed on the lower surface 4*r* of the base 4 after the thickness-reducing.

1.5 Dicing Step

Figure 11:
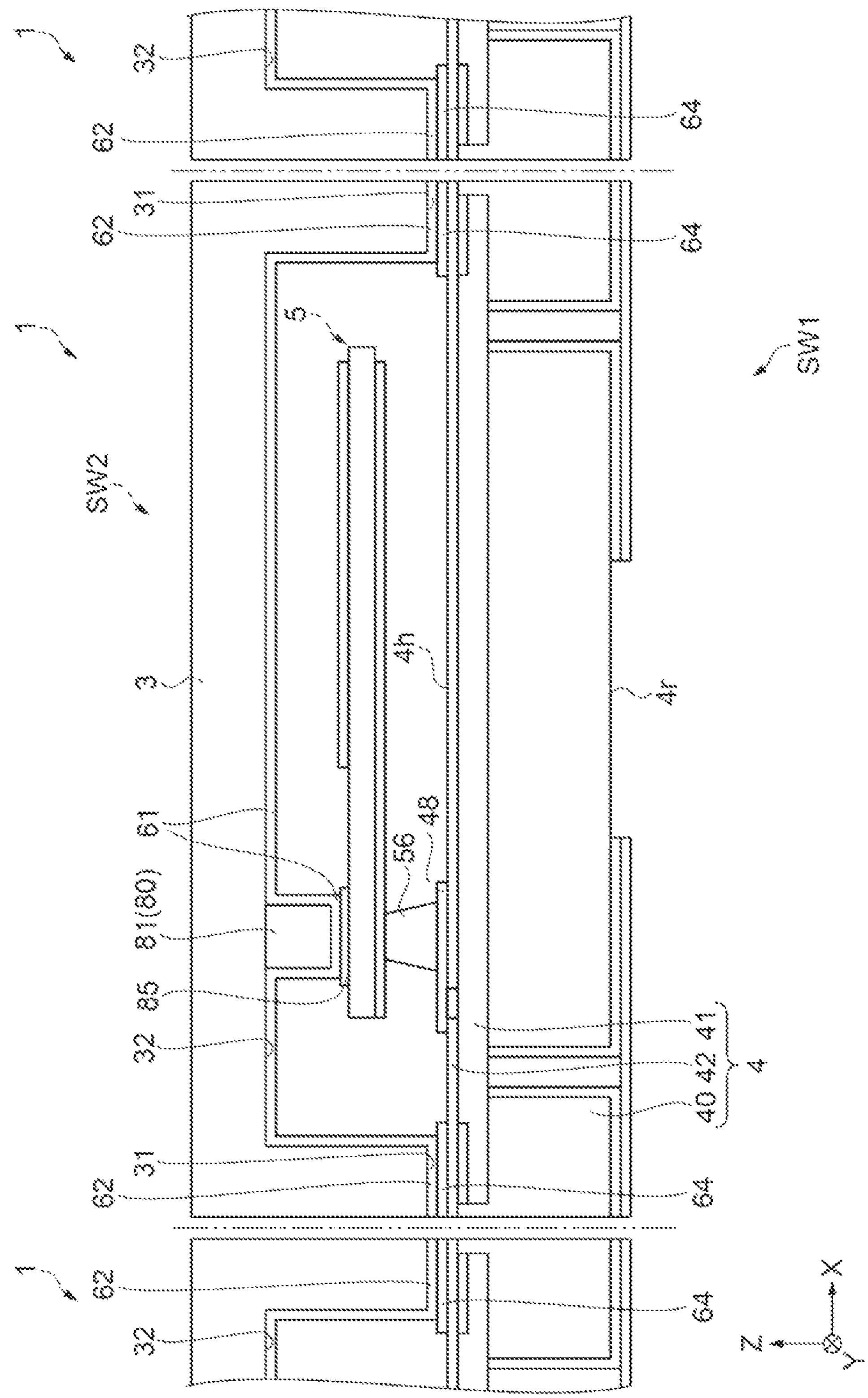
FIG. 11 is a schematic cross-sectional view showing the manufacturing process of the resonator device according to the first embodiment.

As shown in FIG. 11, in step S5, each of the resonator devices 1 is diced from the silicon wafer by a cutting method such as dicing.

The resonator device 1 can be manufactured by the manufacturing process described above.

As described above, according to the present embodiment, the following effects can be obtained.

The resonator device 1 includes the resonator element 5 having the first surface 5*r* on which the first mount electrode 53*a* and the second mount electrode 53*b* electrically coupled to the excitation electrodes 52 are disposed, the base having the first base electrode 48 and the second base electrode 49, the first metal bump 56 by which the first mount electrode 53*a* and the first base electrode 48 are bonded and electrically coupled, the second metal bump 57 by which the second mount electrode 53*b* and the second base electrode 49 are bonded and electrically coupled, and the bonding members 80 by which the second surface 5*h* in front-back relationship with the first surface 5*r* of the resonator element 5 and the fourth surface 321 of the lid 3 that faces the second surface 5*h* are bonded. Then, the loss tangent of the bonding members 80 at a room temperature is set to be larger than the loss tangent of the first metal bump 56 and the second metal bump 57 at a room temperature. Accordingly, by using the first metal bump 56 and the second metal bump 57, the resonator device 1 can be reduced in size, and the resonation leakage caused by the assembly variation or the like can be reduced due to the resonation damping effect of the bonding member 80, so that the resonator device 1 having stable frequency characteristics can be obtained. That is, the small and high-performance resonator device 1 can be obtained.

In addition, by providing the bonding member 80, the resonator element 5 is sandwiched and fixed from both surfaces including the second surface 5*h* and the first surface 5*r* of the resonator element 5 by the bonding member 80, the first metal bump 56, and the second metal bump 57, so that impact resistance of the resonator element 5 can be improved, and the resonator device 1 having high reliability can be obtained.

2. Second Embodiment

Next, a resonator device 1*b* according to a second embodiment will be described with reference to FIG. 12. In the following description, differences from the first embodiment described above will be mainly described, and the same components as those of the first embodiment will be denoted by the same reference numerals, and redundant description thereof will be omitted.

Figure 12:
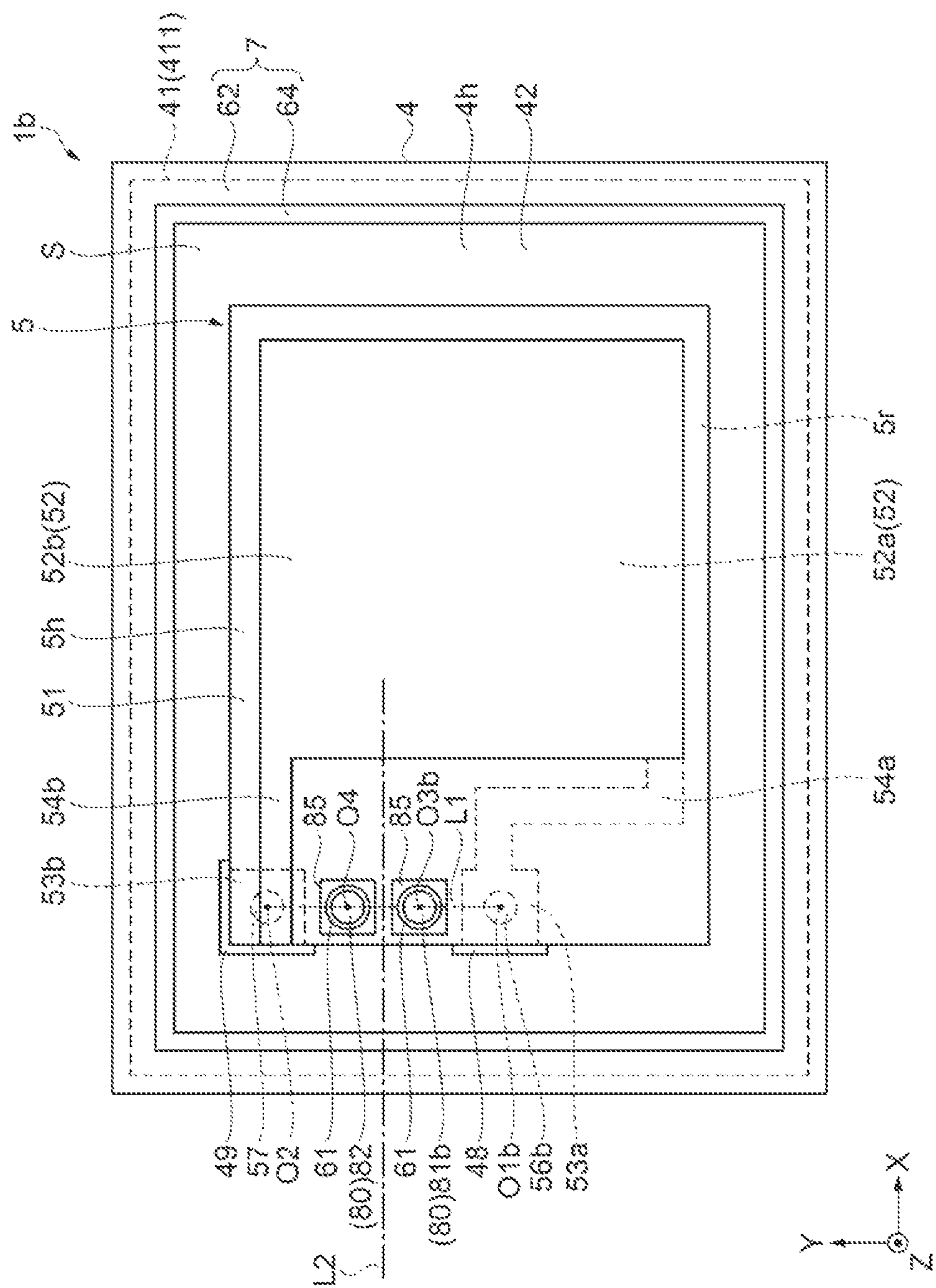
FIG. 12 is a plan view showing a schematic configuration of a resonator device according to a second embodiment.

As shown in FIG. 12, in the resonator device 1*b* according to the present embodiment, a distance between a first metal bump 56*b* and the second metal bump 57 is shorter than that in the first embodiment, and accordingly, a distance between a first bonding member 81*b* and the second bonding member 82 is also shorter than that in the first embodiment.

Specifically, as shown in FIG. 12, the first metal bump 56*b* and the first bonding member 81*b* are disposed on a positive side in the Y direction with respect to those of the first embodiment. Accordingly, in the present embodiment, the distance between the first metal bump 56*b* and the second metal bump 57 and the distance between the first bonding member 81*b* and the second bonding member 82 are shorter than those in the first embodiment.

The first bonding member 81*b* and the second bonding member 82 are disposed on inner sides with respect to the first metal bump 56*b* and the second metal bump 57 in the Y direction which is a direction in which the first metal bump 56*b* and the second metal bump 57 are disposed.

In the plan view from the Z direction, when a line segment coupling a center O1*b* of the first metal bump 56*b* and the center O2 of the second metal bump 57 is defined as the line segment L1, a center O3*b* of the first bonding member 81*b* and the center O4 of the second bonding member 82 are disposed so as to overlap the line segment L1.

When a line orthogonal to the line segment L1 and equally dividing the line segment L1 is defined as the virtual center line L2, the first bonding member 81*b* and the second bonding member 82 are disposed line-symmetrically with respect to the virtual center line L2 in the plan view from the Z direction.

According to the present embodiment, the same effects as those of the first embodiment can be obtained.

The above-described resonator devices 1, 1*b* can be suitably used as an oscillator or an inertial sensor such as an acceleration sensor or an angular velocity sensor.

What is claimed is:

1. A resonator device, comprising:

a resonator element that includes an excitation electrode, and that has a first surface on which a first mount electrode and a second mount electrode electrically coupled to the excitation electrode are disposed, and a second surface in a front-back relationship with the first surface;

a base that has a third surface which faces the first surface of the resonator element and on which a first base electrode and a second base electrode are disposed;

a lid that has a fourth surface which faces the second surface of the resonator element, and that is bonded to the base so as to accommodate the resonator element;

a first metal bump by which the first mount electrode and the first base electrode are bonded and electrically coupled;

a second metal bump by which the second mount electrode and the second base electrode are bonded and electrically coupled; and a bonding member by which the second surface and the fourth surface are bonded, wherein a loss tangent of the bonding member at a room temperature is larger than a loss tangent of the first metal bump and the second metal bump at the room temperature.

2. The resonator device according to claim 1, wherein the bonding member is a resin bump.

3. The resonator device according to claim 1, wherein the bonding member includes a first bonding member and a second bonding member, and the first bonding member and the second bonding member are disposed on inner sides with respect to the first metal bump and the second metal bump in a direction in which the first metal bump and the second metal bump are disposed.

4. The resonator device according to claim 3, wherein the first bonding member and the second bonding member are disposed such that at least a part thereof overlaps a line segment coupling a center of the first metal bump and a center of the second metal bump in a plan view from a direction orthogonal to the third surface.

5. The resonator device according to claim 4, wherein a center of the first bonding member and a center of the second bonding member are disposed so as to overlap the line segment coupling the center of the first metal bump and the center of the second metal bump in the plan view.

6. The resonator device according to claim 3, wherein in a plan view from a direction orthogonal to the third surface, the first bonding member and the second bonding member are disposed line-symmetrically with respect to a virtual center line which is orthogonal to a line segment coupling a center of the first metal bump and a center of the second metal bump and which equally divides the line segment.

7. The resonator device according to claim 1, wherein the bonding member is bonded to the second surface via a first metal layer.

8. The resonator device according to claim 7, wherein the first metal layer covers the bonding member and the fourth surface.

9. The resonator device according to claim 7, wherein the first metal layer contains gold.

10. The resonator device according to claim 7, wherein the lid is bonded to the base via a second metal layer containing gold.

11. The resonator device according to claim 10, wherein the first metal layer and the second metal layer are electrically coupled.

12. The resonator device according to claim 1 further comprising:

an oscillation circuit formed on the base, wherein the excitation electrode and the oscillation circuit are electrically coupled via the first metal bump and the second metal bump.

* * * * *